US012760410B2

(12) United States Patent
Chowdhury et al.

(10) Patent No.: US 12,760,410 B2
(45) Date of Patent: Oct. 13, 2026

(54) NANOPOROUS GaN ON P-TYPE GaN: A Mg OUT-DIFFUSION COMPENSATION LAYER FOR HEAVILY Mg-DOPED P-TYPE GaN

(71) Applicant: The Board of Trustees of the Leland Stanford Junior University, Stanford, CA (US)

(72) Inventors: Srabanti Chowdhury, San Ramon, CA (US); Kwangjae Lee, Santa Clara, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 179 days.

(21) Appl. No.: 18/487,543

(22) Filed: Oct. 16, 2023

(65) Prior Publication Data

US 2024/0133027 A1 Apr. 25, 2024

Related U.S. Application Data

(60) Provisional application No. 63/416,340, filed on Oct. 14, 2022.

(51) Int. Cl.
*C23C 16/30* (2006.01)
*C23C 16/02* (2006.01)
*C23C 16/04* (2006.01)

(52) U.S. Cl.
CPC ........ *C23C 16/303* (2013.01); *C23C 16/0227* (2013.01); *C23C 16/045* (2013.01)

(58) Field of Classification Search
None
See application file for complete search history.

(56) References Cited

U.S. PATENT DOCUMENTS

2015/0303655 A1* 10/2015 Han .................... H01S 5/18363 438/32
2019/0115448 A1* 4/2019 Chowdhury ....... H10D 30/0515

OTHER PUBLICATIONS

Tomita et al., "Reduction of Mg segregation in a metalorganic vapor phase epitaxial grown GaN layer by a low-temperature AlN interlayer", 2008, Journal of Applied Physics 104, 014906.

* cited by examiner

*Primary Examiner* — Shamim Ahmed
*Assistant Examiner* — Bradford M Gates
(74) *Attorney, Agent, or Firm* — LUMEN PATENT FIRM

(57) ABSTRACT

Improved fabrication is provided for devices in the GaN material system that require an embedded p-type layer. The effect of Mg diffusion from the p-type layer is compensated for using an GaN interlayer that is etched to be nanoporous at its top surface. In addition to serving as a diffusion barrier, the GaN interlayer preferably has C and O impurities from the etch that tend to compensate unwanted Mg doping in layers above the GaN interlayer. Importantly, the entire structure can be grown at high temperatures, which desirably avoids low temperature growth steps that tend to reduce material quality.

7 Claims, 12 Drawing Sheets

NANOPOROUS GaN ON P-TYPE GaN: A Mg OUT-DIFFUSION COMPENSATION LAYER FOR HEAVILY Mg-DOPED P-TYPE GaN

CROSS REFERENCE TO RELATED APPLICATIONS

This application claims the benefit of US provisional patent application 63/416,340, filed on Oct. 14, 2022, and hereby incorporated by reference in its entirety.

FIELD OF THE INVENTION

This invention relates to device fabrication in the gallium nitride material system.

BACKGROUND

Mg doping of GaN has a chronic problem called Mg out-diffusion that commonly presents in the thin film growth using metalorganic chemical vapor deposition (MOCVD). The thin film grown on top of p-GaN contains a significant amount of Mg as plenty of Mg atoms consistently remain both on the surface of p-GaN itself and in the MOCVD reactor even though the Mg supply is ceased. This leads to the incorporation of Mg into subsequently grown layers and blurs the doping boundary between p-GaN and other circumjacent epitaxial layers, severely reducing the reliability of the designed doping structure and device performance.

SUMMARY

In this work, we describe the use of a nanoporous GaN (NP GaN) insertion layer for compensation of the Mg out-diffusion. Embedding p-type gallium nitride (p-GaN) with controlled Mg out-diffusion in adjacent epitaxial layers is a key for designing various multi-junction structures with high precision and enabling more reliable bandgap engineering of III-nitride-based optoelectronics and electronics. Here, we report, for the first time, experimental evidence on how nanoporous GaN (NP GaN) can be introduced as a blocking layer for the Mg memory effect of p-GaN. NP GaN on p-GaN provides an ex-situ-formed interface with oxygen and carbon impurities, compensating Mg out-diffusion from p-GaN. To corroborate our findings, we used two-dimensional electron gas (2DEG) formed at the interface of AlGaN/GaN as the indicator to study the impact of the Mg out-diffusion from underlying layers. Electron concentration evaluated from the capacitance-voltage measurement shows that $9\times10^{12}$ $cm^{-2}$ of carriers accumulate in the AlGaN/GaN 2DEG structure grown on NP GaN, which is almost same number of carriers as that grown with no p-GaN. In contrast, 2DEG on p-GaN without NP GaN presents $9\times10^{9}$ $cm^{-2}$ of the electron concentration, implying the 2DEG structure is depleted by Mg out-diffusion. The results address the efficacy of NP GaN and its role in successfully embedding p-GaN in multi-junction structures for various state-of-the-art III-nitride-based devices.

Significant advantages relative to other approaches are provided. Over the past few years, several solutions have been suggested to suppress or compensate the Mg out-diffusion, for example, alternative growth using molecular beam epitaxy (MBE), ex-situ chemical pre-treatment on the p-GaN surface, in-situ carbon (C) doping in MOCVD system, in-situ H2 etching treatment on p-GaN surface, and low temperature (LT) growth techniques using LT-AlN or LT-GaN interlayers. The success of an embedded p-GaN without Mg out-diffusion, as in this work, will be an extremely valuable path to enhance the performance in many state-of-the-art opto-/electronic applications such as current aperture vertical electron transistors (CAVETs), super junction devices, trench metal oxide semiconductor field effect transistors (MOSFETs), n-p-n heterojunction bipolar transistors (HBTs), tunnel junction micro-LEDs, and so on. Elaborating on super junction devices, a bottom p-type structure can lead to unprecedented benefits in the technology by offering a more uniform electric field throughout the active region of the transistor.

This intermediate layer provides both a barrier to Mg diffusion into device layers and diffusion of Mg-compensating impurities (e.g., C and O) into the device layers.

DETAILED DESCRIPTION

Figure 1A:
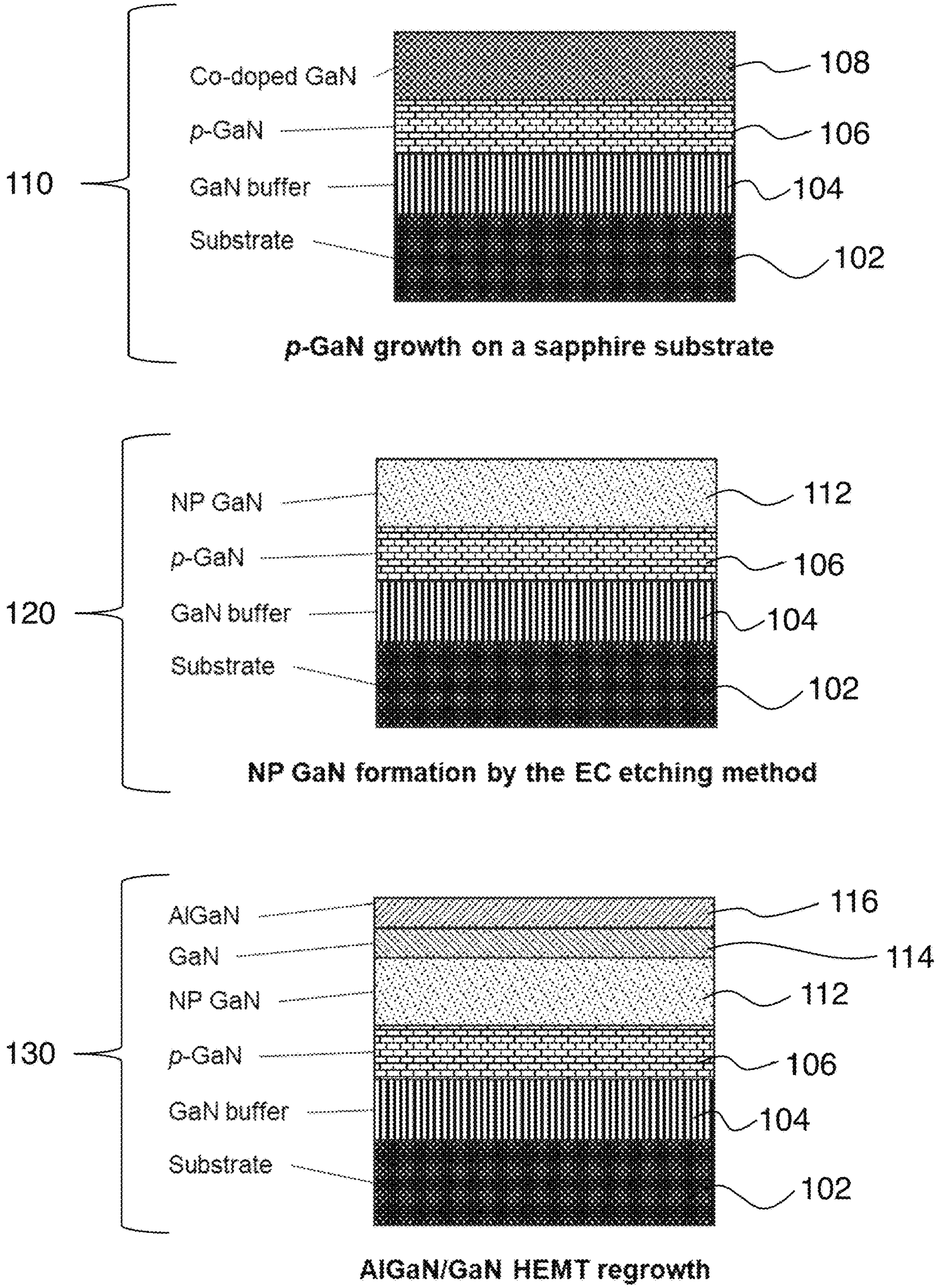
FIG. 1A schematically shows co-doped GaN over p-GaN, formation of a NP-GaN layer on the p-GaN, and overgrowth of an AlGaN/GaN structure on the NP-GaN.

Section A describes general principles relating to embodiments of the invention, and section B relates to a detailed experimental example.

A) General Principles

An exemplary embodiment of the invention is a method of compensating effects of Mg diffusion in growth of III-nitride devices, where the method includes:

- depositing a first layer of Mg-doped p-type GaN on a device substrate;
- depositing a second layer of GaN on the first layer;
- etching a top surface of the second layer to make it porous; and
- depositing one or more additional device layers on the second layer after the etching;

Here effects of Mg diffusion into the one or more additional device layers are compensated by the second layer. A device substrate can be a bare substrate (e.g., sapphire), or a bare substrate that is prepared for further growth by growing one or more buffer layers on it, such as 104 on FIG. 1A. Such buffer layers are well known in the art. Practice of the invention does not depend critically on details of the device substrate. Thus, in some embodiments, the device substrate includes a GaN buffer layer deposited on a substrate.

Preferably the etching a top surface of the second layer to make it porous is performed with an electrochemical etch. In this case, the electrochemical etch is preferably performed with an applied voltage in a range from 5 V to 20 V, so that pores formed in the second layer are small enough to be removed by the deposition of the one or more additional device layers.

The etching a top surface of the second layer to make it porous preferably introduces C and/or O impurities into the second layer that provide compensatory doping of the unintended doping due to Mg diffusion.

Deposition temperatures of the first layer, the second layer and the one or more additional device layers are each in a range from 800° C. to 1150° C. For example, p-GaN can be grown in a temperature range from 800° C.-900° C., normal GaN can be grown in a temperature range from 1020° C. to 1100° C., and normal $Al_{0.3}Ga_{0.7}N$ can be grown in a temperature range from 1050° C. to 1150° C. This ability to grow the entire structure at high temperatures is one of the key advantages of the present approach, since high temperature growth is typically needed for good material quality in the GaN material system.

Suitable deposition methods of the first layer, the second layer and/or the one or more additional device layers include MOCVD (metal-organic chemical vapor deposition) and MOVPE (metal-organic vapor phase epitaxy).

B) Experimental Example

B1) Introduction

Gallium nitride (GaN) possesses outstanding electrical and optical characteristics due to its wide bandgap, high electron drift velocity, and high transmittance exceeding 82% over the entire visible wavelengths. The thermal, mechanical, and chemical stability of GaN indicates high material and device reliability. Furthermore, ease of doping controls for the desired carrier concentrations and the tunable bandgap with alloys ($In_xAl_yGa_{1-x-y}N$) facilitate practical applications of power devices, photo/gas-detectors, light-emitting diodes (LEDs), and laser diodes (LDs).

Unlike in silicon-based thin films where p-type layers can be embedded appropriately in a device structure to achieve a barrier to current flow or electric field mitigation, p-type GaN (p-GaN) presents a plethora of challenges due to uncontrolled diffusion of Mg. The success of an embedded p-GaN will be extremely valuable path to enhance the performance in many state-of-the-art opto-/electronic applications such as current aperture vertical electron transistors (CAVETs), super junction devices, trench metal oxide semiconductor field effect transistors (MOSFETs), n-p-n heterojunction bipolar transistors (HBTs), tunnel junction micro-LEDs, and so on. Elaborating on super junction devices, a bottom p-type structure can lead to unprecedented benefits in the technology by offering more uniform electric field throughout the active region of the transistor. However, Mg doping of GaN has a chronic problem called 'Mg out-diffusion' that commonly presents in the thin film growth using metalorganic chemical vapor deposition (MOCVD). The thin film grown on top of p-GaN contains a significant amount of Mg as plenty of Mg atoms consistently remain both on the surface of p-GaN itself and in the MOCVD reactor even though the Mg supply is ceased. This leads to the incorporation of Mg into subsequently grown layers and blurs the doping boundary between p-GaN and other circumjacent epitaxial layers, severely reducing the reliability of the designed doping structure and device performance. Over the past few years, promising solutions have been suggested to suppress or to compensate the Mg out-diffusion, for example, alternative growth using molecular beam epitaxy (MBE), ex-situ chemical pre-treatment on the p-GaN surface, in-situ carbon (C) doping in MOCVD system, in-situ H2 etching treatment on p-GaN surface, and low temperature (LT) growth techniques using LT-AlN or LT-GaN interlayers. Utilizing MBE system for the thin film growth on p-GaN can fundamentally suppress the out-diffusion of Mg due to the reduced Mg diffusion length at a low growth temperature. The hydrofluoric (HF) acid with $UV/O_3$ pre-treatment removes most of the Mg atoms accumulated on the p-GaN surface that significantly mitigates the Mg out-diffusion rate into the regrown GaN layers. Also, the intervention of C impurity in regrown GaN on p-GaN provides the Mg compensation effect by semi-insulating properties because of the formation of deep acceptor levels introduced by the C doping. In-situ $H_2$ etching treatment removes Mg atoms accumulated on the p-GaN surface and hence reduces the available Mg atoms for out-diffusion into subsequent layers. The insertion of LT-AlN (or LT-GaN) interlayers between p-GaN and the regrown layer effectively restrains the Mg out-diffusion rate owing to the redistribution of Mg at their interfaces. Recently, a pulsed growth method of LT-GaN has been reported for not only suppressing the Mg out-diffusion but also growing of high crystalline thin films with dramatically improved surface morphology since the continuous LT growth (<900° C.) considerably degrades the surface quality of GaN thin films.

Motivated by this goal, we introduce nanoporous (NP) GaN fabricated on p-GaN as a Mg compensation interlayer containing both the C and the oxygen (O) impurities. High 0 concentration ($2\times10^{18}$ $cm^{-3}$) in GaN provides a shallow donor level that plays the role of Mg compensator. Besides, additional C ($3\times10^{18}$ $cm^{-3}$) makes the regrown GaN on p-GaN a semi-insulating layer. Secondary ion mass spectrometry (SIMS) depth profiling of regrown AlGaN/GaN on p-GaN shows that the NP GaN increases C and O levels due to the $Ga_xO_y$:C remained by the electrochemical (EC) etching process. Basically, in the case of regrowth on p-GaN with a NP GaN layer, high crystalline quality of thin films can be maintained because no LT growth methods are required. We demonstrate that the influence of Mg out-diffusion can be eliminated in the regrowth process for AlGaN/GaN two-dimensional electron gas (2DEG) structure on p-GaN by introducing NP GaN. In fact, NP GaN has been considered as a versatile platform for various applications such as enhancing light extraction of LEDs/LDs, the lifting-off substrate for flexible devices, water splitting, supercapacitors for energy storage, and highly efficient solar cells. Our work shows a new function of NP GaN as an Mg out-diffusion compensation layer that facilitates accurate designs for p-GaN embedded GaN-based device structures.

For conclusive experimental studies resulting in quantitative estimation of the efficacy of NP GaN on Mg out-diffusion, we decided to use the ultra-sensitive 2DEG layer. From our prior studies, it has been established that the 2DEG is very sensitive to Mg or other impurities. The 2DEG can be also easily measured by simple C-V technique and therefore easily traceable, quantitatively. Thus, our experiments were designed with a 2DEG as an indicator which was accurately measured with C-V measurements to assess the success of the techniques.

B2) Results

Unintentionally doped (UID)-GaN and p-GaN thin films were grown on a c-plane sapphire substrate by MOCVD. LT-GaN was grown on the substrate at 520° C. as a nucleation layer for the growth of 1.5 μm-thick UID-GaN. A 300 nm-thick p-GaN (Mg: $2\times10^{19}/cm^3$) layer was grown on the UID-GaN at 930° C. and a 100 nm-thick n-type GaN (n-GaN) layer (Si: $7\times10^{18}$ $cm^{-3}$) was sequentially grown at the same temperature. This n-GaN is denoted as 'co-doped GaN' because of unintentionally doped Mg atoms (Mg$<2\times10^{19}$ $cm^{-3}$) by the Mg out-diffusion.

The co-doped GaN layer of the samples was electrochemically etched in 0.2 M oxalic acid electrolyte at room temperature for 10 mins using a platinum wire as a cathode to form the NP GaN layer. The porosity of NP GaN was controlled by the applied voltages in EC etching process of the co-doped GaN layer. After the EC etching process, chemical cleaning processes were conducted with diluted ammonia hydroxide/hydrogen peroxide mixture (SC1) and hydrochloric/hydrogen peroxide mixture (SC2). Lastly, the samples were rinsed thoroughly by deionized water for 10 mins.

To regrow the $Al_{0.3}Ga_{0.7}N$/GaN 2DEG structure on NP GaN, the samples were thermally cleaned in a MOCVD reactor at 980° C. for 5 mins in $H_2/NH_3$ ambient. 140 nm-thick UID-GaN and 30 nm-thick $Al_{0.3}Ga_{0.7}N$ were regrown on NP GaN/p-GaN at 1025° C. and 1080° C., respectively.

Figure 1B:
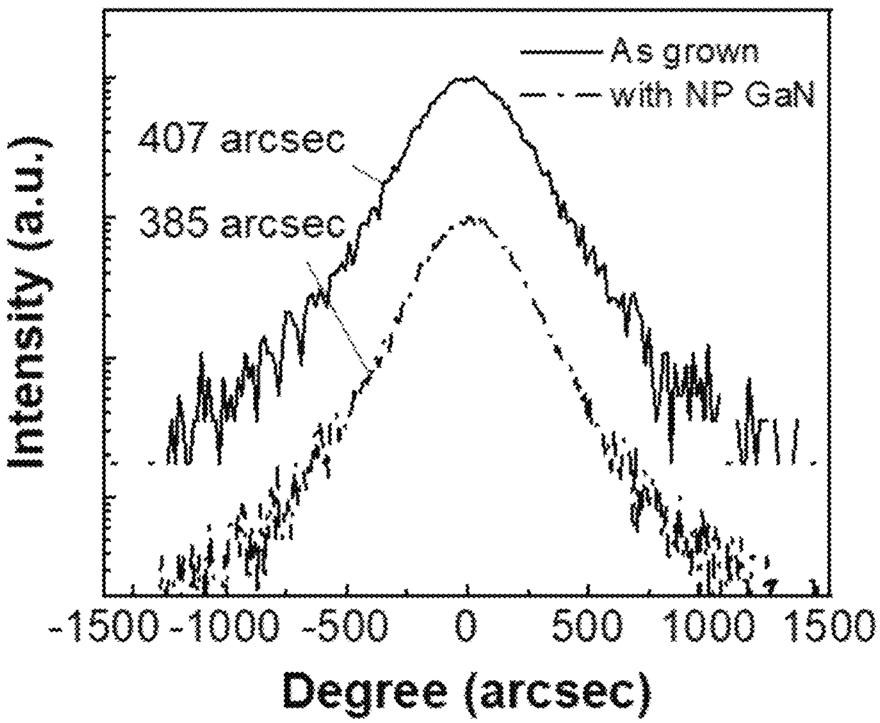
FIG. 1B shows X-ray diffraction results for structures with and without the NP-GaN.
Figure 1C:
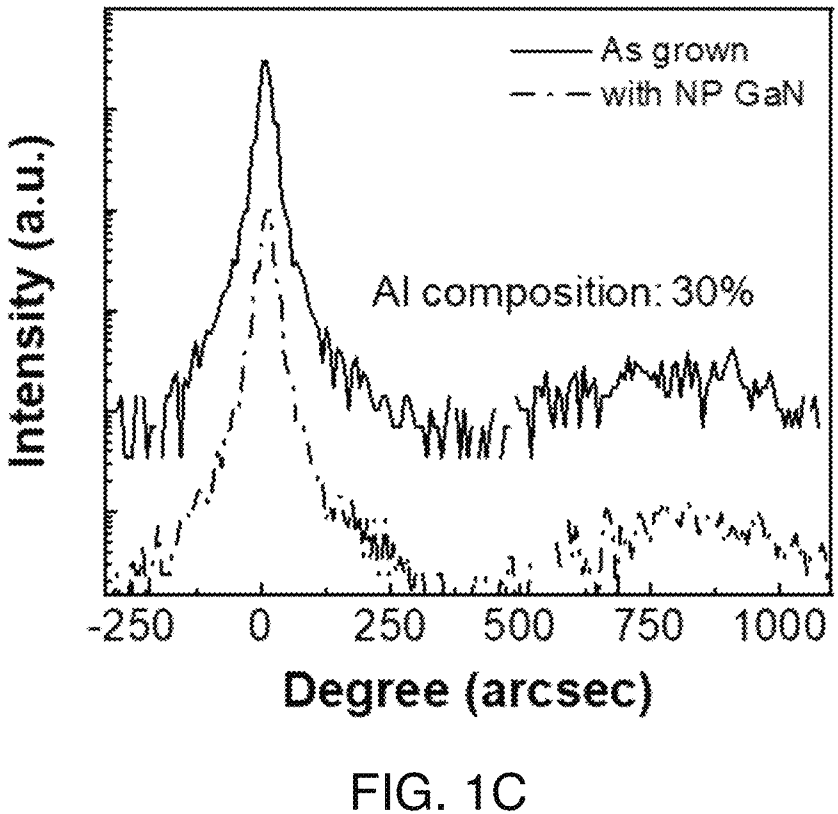
FIG. 1C show images of structures with and without the NP-GaN.
Figure 1D:
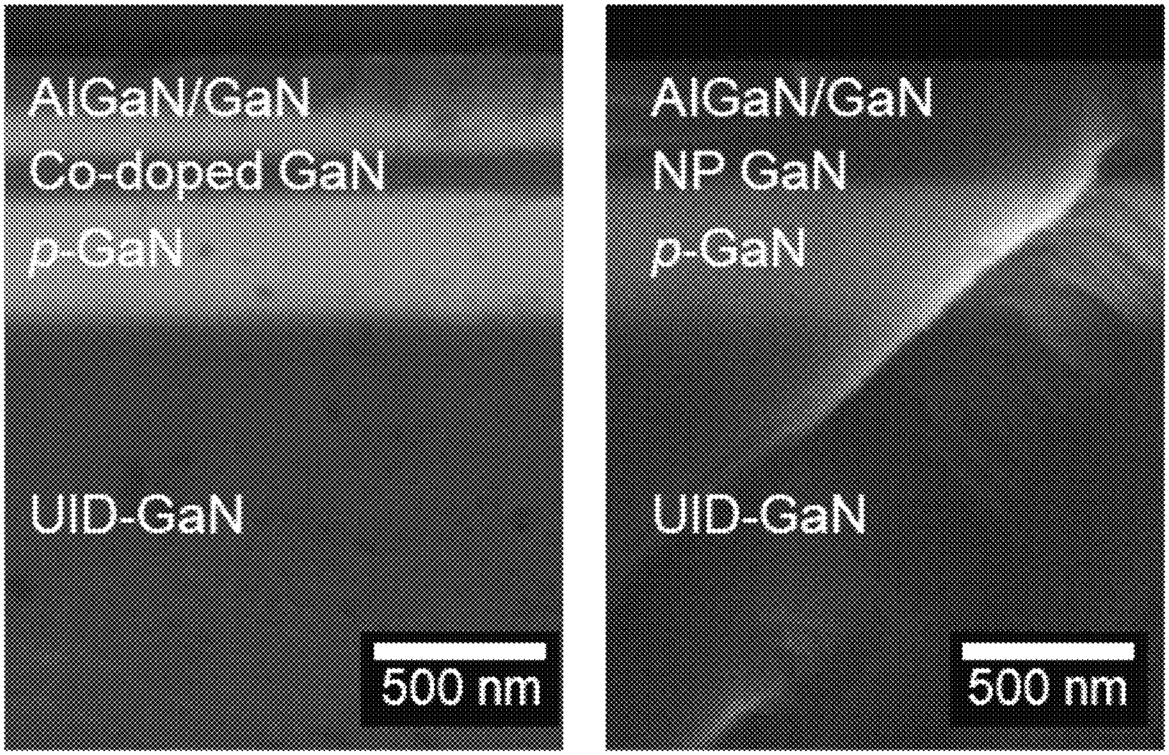
FIG. 1D shows cross-sectional SEM (scanning electron microscope) images of the regrown AlGaN/GaN structure before and after NP GaN formation.

FIG. 1A shows an exemplary process flow for NP GaN formation between p-GaN and AlGaN/GaN 2DEG structure. Here 110 shows the result of co-doped GaN (108)/p-GaN (106) growth on a sapphire substrate (102) with a UID buffer layer (104). 120 shows formation of a nanoporous layer 112 in the selective layer (co-doped GaN) by the EC etching method. 130 shows the result of AlGaN (116)/GaN (114) 2DEG structure regrowth. FIG. 1B shows X-ray diffraction (XRD) omega scans and FIG. 1C shows 2theta-omega scans on (0002) plane of the regrown AlGaN/GaN structure with and without NP GaN on p-GaN. FIG. 1D shows cross-sectional SEM (scanning electron microscope) images of the regrown AlGaN/GaN structure before and after NP GaN formation.

To explore Mg out-diffusion into the regrown thin films on p-GaN, we grew AlGaN/GaN 2DEG structure with NP GaN on p-GaN. FIG. 1A sequentially shows the process flow of co-doped GaN/p-GaN/UID-GaN thin film growth, EC etching, and AlGaN/GaN regrowth for 2DEG. The Mg doping concentration for p-GaN is $\sim2\times10^{19}$ $cm^{-3}$. Si dopants ($\sim7\times10^{18}$ $cm^{-3}$) were intentionally introduced in the growth process of the co-doped GaN. X-ray diffraction (XRD) omega scans were conducted, as shown in FIG. 1B, to characterize the crystalline quality of the regrown AlGaN/GaN structures with and without NP GaN. The full width at half maximum (FWHM) of (0002) plane typically represents the lattice distortion originating from screw dislocations and mixed dislocations in the epitaxial thin film. The dislocation density ($\rho_s$) from XRD results is evaluated by:

$$\rho_s = \beta^2_{(0002)}/(2\pi\ln 2\times|b_c|^2),$$

where $\beta_{(0002)}$ is the FWHM of (0002) planes, $b_c$ is the Burgers vector lengths equated to c-axial lattice constant. The FWHM value of the (0002) diffraction peak is 385 and 407 arcsec for the complete stacks including regrown AlGaN/GaN with and without NP GaN, respectively. The calculated $\rho_s$ is $1.08\times10^9$ and $9.65\times10^8$ $cm^{-2}$ for regrown GaN without and with NP GaN, respectively. This result indicates that the NP GaN insertion layer slightly improves the crystallinity of AlGaN/GaN structure. The AlGaN structure was designed to have an Al composition of 30% like that of a general GaN-based high electron mobility transistor (HEMT) structure. Al composition in AlGaN was also measured by 2theta-omega scans, as shown in FIG. 1C. The results reveal that the 30 nm-thick AlGaN layers with and without NP GaN have the similar Al composition of 30%. FIG. 1D shows cross-sectional SEM images of AlGaN/GaN layers grown on p-GaN. p-GaN shows relatively white in SEM images due to its low electron conductivity. After we regrew AlGaN/GaN on co-doped GaN/p-GaN as shown in FIG. 1D (left), we observed white tails implying that Mg diffusion occurred in the regrown AlGaN/GaN regions. Meanwhile, the co-doped GaN layer does not show its tails due to intentional Si doping. Without the EC etching process of co-doped GaN, the regrown AlGaN/GaN layer shows Mg out-diffusion effect penetrating throughout the co-doped GaN. It also explains that Mg out-diffusion is occurred over the regrown AlGaN/GaN layers despite p-GaN is covered by the 140 nm-thick co-doped GaN layer. In contrast, the AlGaN/GaN layer with NP GaN shows a clear-cut boundary between the p-GaN and AlGaN/GaN as shown in FIG. 1D (right). Therefore, it can be seen from the SEM image that the contrast tail caused by Mg out-diffusion is invisible with embedded NP GaN between AlGaN/GaN and p-GaN.

Figure 2A:
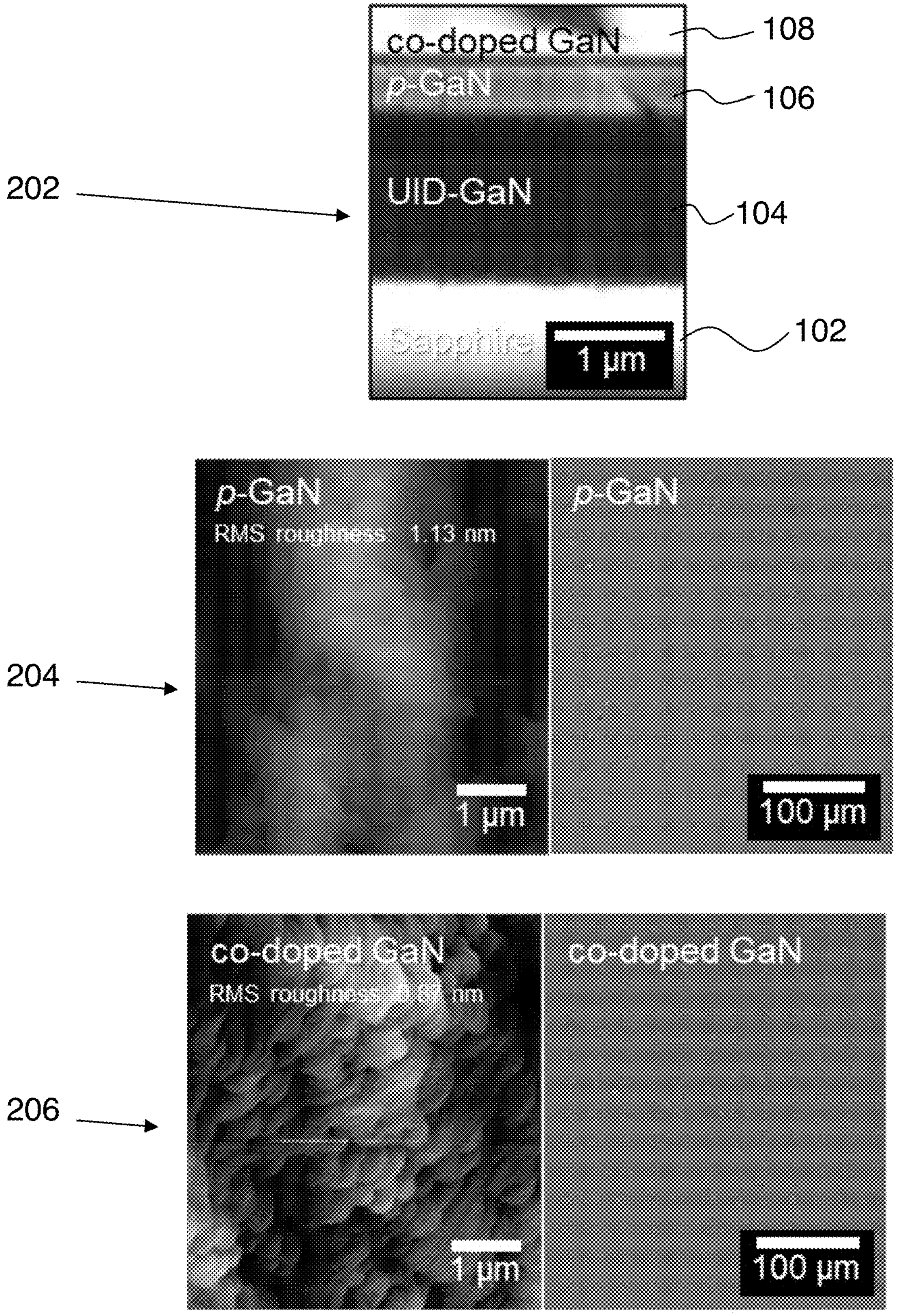
FIG. 2A shows further imaging results of structures with and without the NP-GaN.
Figure 2B:
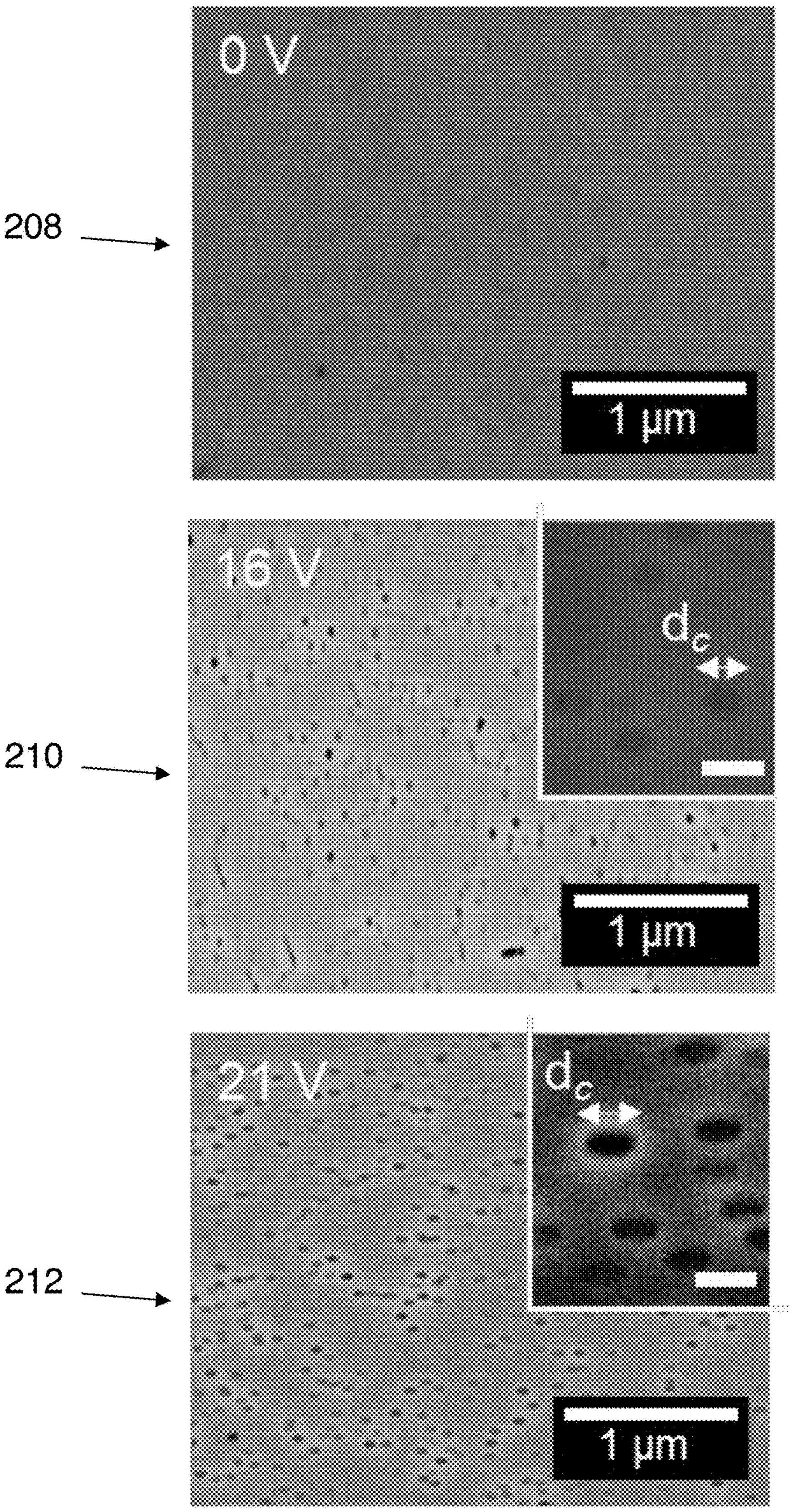
FIG. 2B shows images demonstrating an effect of applied voltage for electrochemical etching on the resulting pore size in the NP-GaN.
Figure 2C:
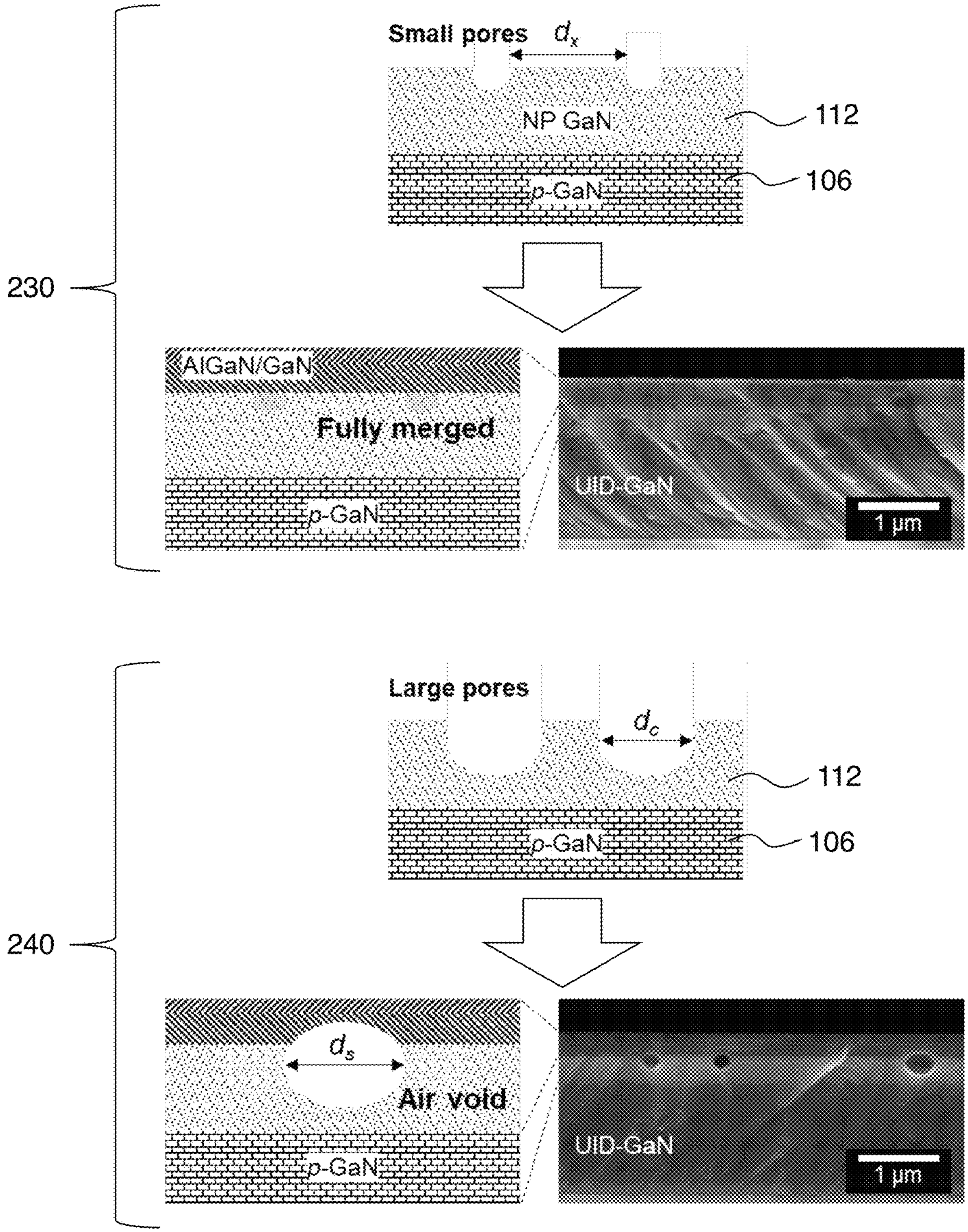
FIG. 2C schematically shows the effect of pore size on subsequent material regrowth.

FIG. 2A shows a cross-sectional SEM image of p-GaN with co-doped GaN (202), AFM images and optical microscope images (left and right, respectively) of the top p-GaN surface without (204) and with (206) co-doped GaN. FIG. 2B shows SEM images (208, 210, 212) of the top view of NP GaN after the EC etching process with a different applied voltage (0 V, 16 V, and 21 V, respectively). FIG. 2C show schematic diagrams of the expected epitaxial thin film regrowth mechanism with NP GaN depending on the pore size and cross-sectional SEM images of the epitaxial layers with a different pore size. Here 230 schematically shows the process when the pore size is small, and 240 schematically shows the process when the pore size is large.

The surface morphology of p-GaN with co-doped GaN was examined by atomic force microscopy (AFM) and optical microscope as shown in FIG. 2A. The cross-sectional SEM image displays a 140 nm-thick co-doped GaN layer on p-GaN before the regrowth of AlGaN/GaN. The optical microscope images demonstrate that the surfaces of the epitaxial film are flat and smooth regardless of the existence of co-doped GaN. The root-mean-square (RMS) roughness of top surface is 1.13 and 0.87 nm without and with co-doped GaN in a 5×5 $\mu m^2$ region, respectively, and the size and quantity of defect pits in both samples are similar. To fabricate NP GaN from co-doped GaN, an EC etching process was conducted. Applied voltages of 16 and 21 V were used in the EC etching process to control the density and size of nanopores. The average diameters of nanopores (do) formed at the applied voltages of 16 and 21 V are 13.7 and 20.7 nm, respectively. The $d_c$ of nanopores is increased by applying a higher voltage as shown in the SEM images. It is notable that a relatively high voltage is required for the co-doped GaN to form nanopores compared to that of conventional n-GaN. Then, AlGaN/GaN structure was regrown on the prepared NP GaN samples. In general, the nanopores of NP GaN undergo a shape transformation during the high temperature growth of the AlGaN/GaN structure. As shown in FIG. 2C, the different shape transformations of the nanopores occur at the different voltages of 16 V (230) and 21 V (240). When applying a voltage lower than 16 V, nanopores are merged and annihilated at the regrown interface with NP GaN during the AlGaN/GaN regrowth since the size of nanopores is small. The $d_c$ at higher applied voltages (>16 V) with relatively short distances between nanopores ($d_x$ is high enough to form sphere-like pores ($d_s$) as illustrated in FIG. 2C. These nanopores are transformed into a sphere-like shape during the regrowth at >1040° C. because of the Rayleigh instability which indicates that atoms diffuse from a larger curvature region toward a lower curvature region, making a sphere-like structure, to mitigate a gradient of the surface chemical potential. In addition, the formation of larger nanopores is attributed to the coalescence of nanopores with neighboring ones when $d_s$ is larger than the distance between nanopores. Therefore, the $d_c$ and $d_x$ play a key role to eliminate the existence of nanopores after the regrowth. It is worth to mention that the volume of nanopores can be conserved based on the following relationship:

$$d_s = \sqrt[3]{1.5\pi\sqrt{2}}\, d_c \approx 1.88\, d_c.$$

Figure 3A:
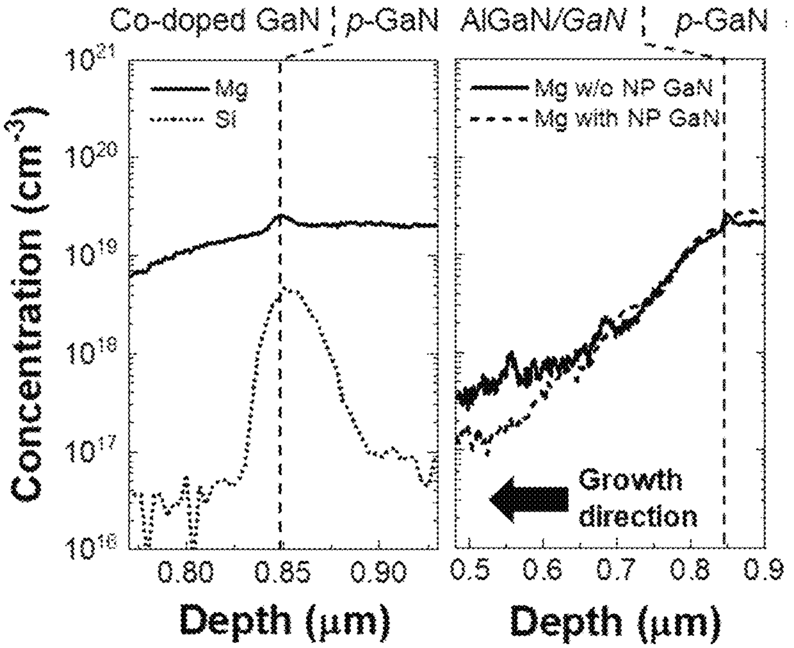
FIGS. 3A-B show SIMS results for structures with and without the NP-GaN.
Figure 3B:
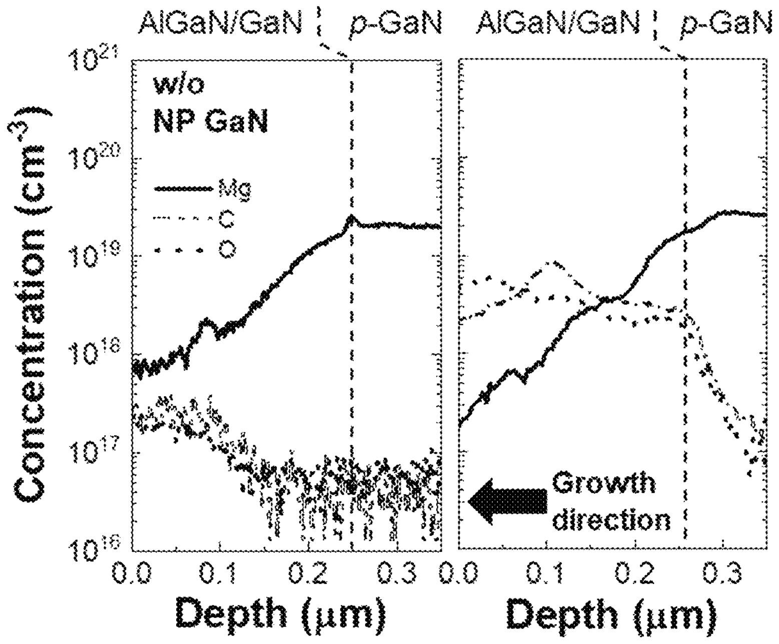
Figure 3C:
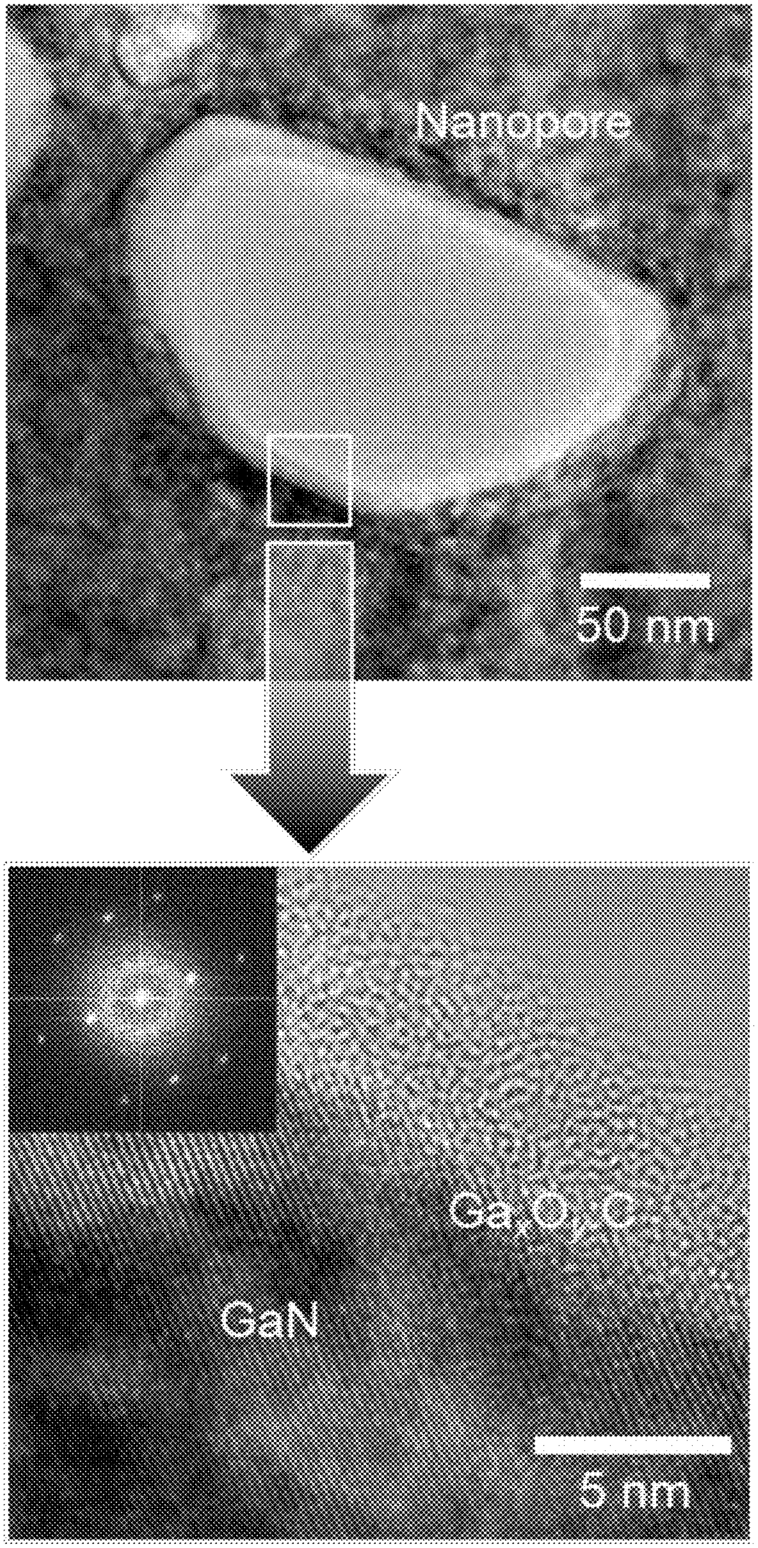
FIG. 3C is an image of a nanopore in the NP-GaN (top) and a magnified view of the pore wall (bottom).

FIG. 3A shows SIMS (secondary ion mass spectroscopy) results of the co-doped GaN layer and Mg out-diffusion tails in AlGaN/GaN with and without NP GaN (same x-label), FIG. 3B shows SIMS results of O and C impurities introduced by the EC etching process in AlGaN/GaN. FIG. 3C is a TEM (transmission electron microscope) image of a sphere-like nanopore in NP GaN after the regrowth.

FIG. 3A shows SIMS results of the co-doped GaN layer and Mg out-diffusion characteristics in AlGaN/GaN with and without NP GaN. As aforementioned, Si was intentionally doped with $7\times10^{18}$ cm$^{-3}$ while Mg began to out-diffuse to AlGaN/GaN from $2\times10^{19}$ cm$^{-3}$. In the AlGaN/GaN layer, the Mg out-diffusion was reduced by 3.2 times with NP GaN up to $1.1\times10^{17}$ cm$^{-3}$ compared to that of AlGaN/GaN without NP GaN ($3.5\times10^{17}$ cm$^{-3}$). Besides, NP GaN enhances the concentration of C and O impurities in the Mg out-diffusion region as shown in FIG. 3B. It is apparent that, in the area around the interface between NP GaN and regrown AlGaN/GaN, the C and O impurities are distributed uniformly throughout the topmost NP GaN. We believe these impurities result from the oxalic acid used in the EC etching process for NP GaN. There is a literature report of the n-GaN EC etching process and its mechanism in oxalic acid that shows anodic part of the EC reaction as follows:

$$2GaN + 2H_2O + C_2O_4^{2-} \rightarrow [(GaO)_2C_2O_4] + N_2 + 4H^+ + 6e^-.$$

Interestingly, C and O impurities were successively detected throughout the AlGaN/GaN structures, implying that the C and O at the periphery of growth surface are continuously accompanied by compensating Mg density during the AlGaN/GaN regrowth at a high temperature (>1040° C.). The TEM images shown in FIG. 3C support the expected mechanism that the C and O impurities trapped in the nanopores are inserted into the regrown AlGaN/GaN structure with compensating Mg.

Figure 4A:
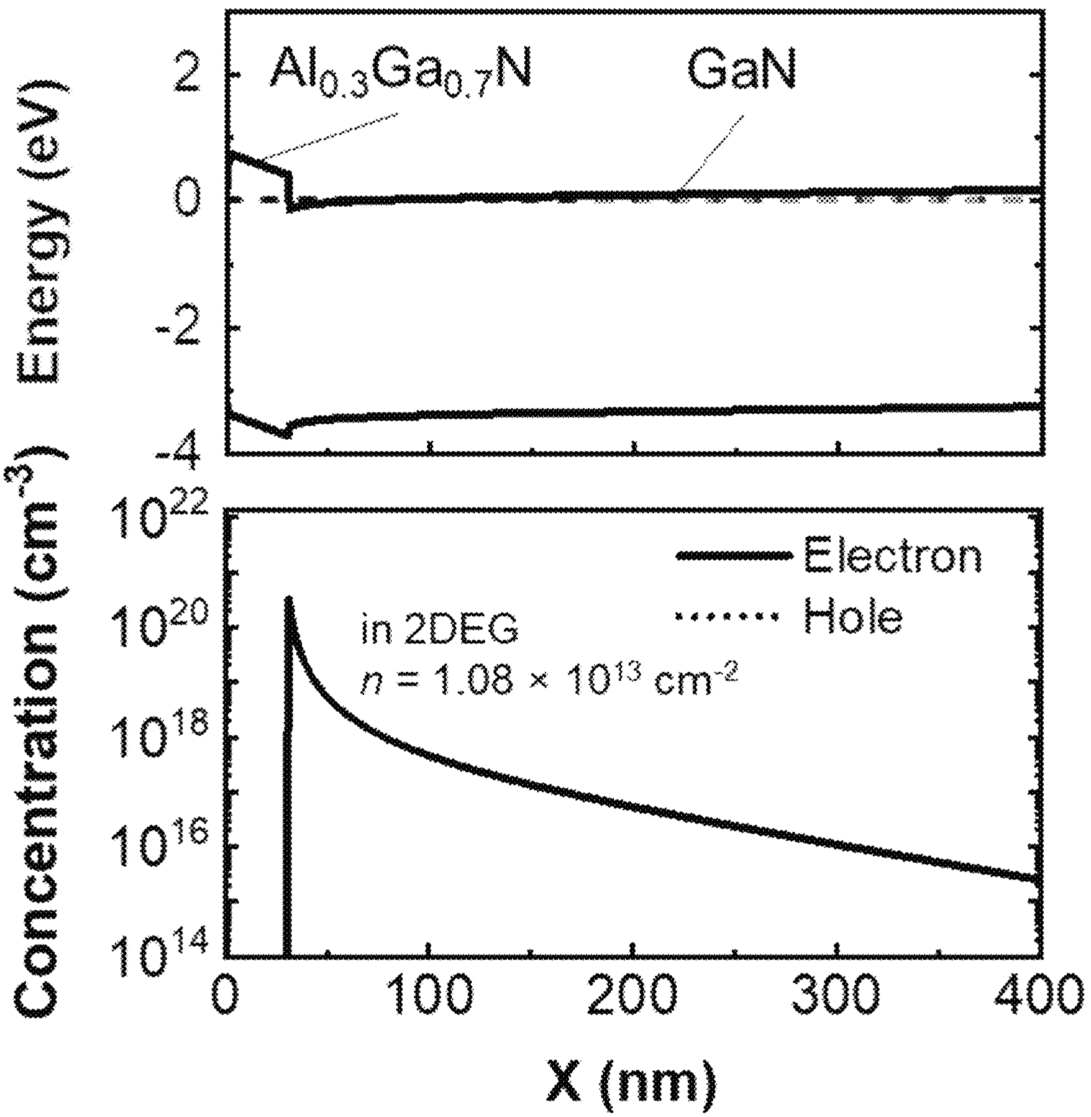
FIGS. 4A-C are band diagram and carrier concentration simulations showing the effect of unintended Mg doping on the 2D electron gas (2DEG).
Figure 4B:
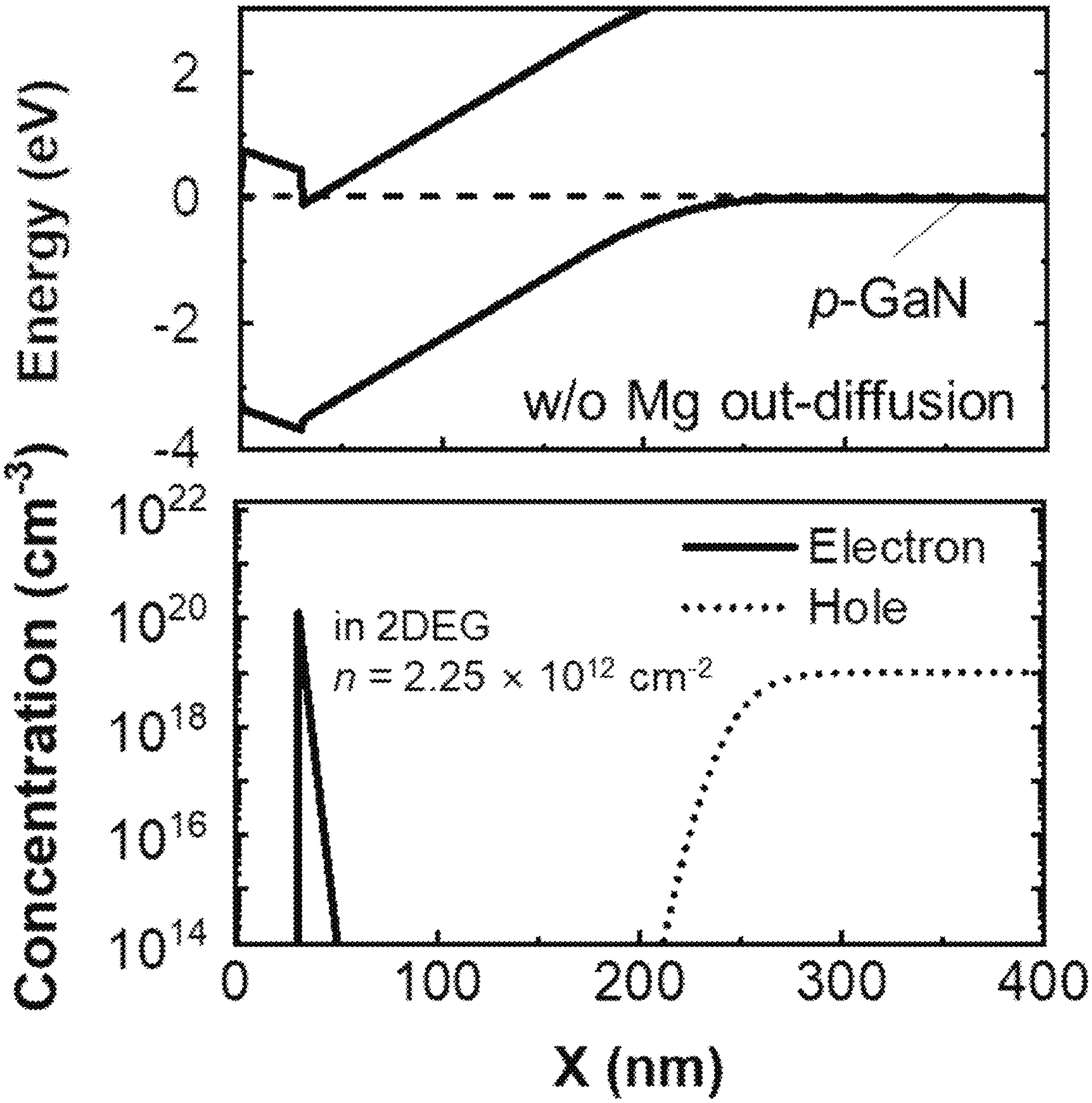
Figure 4C:
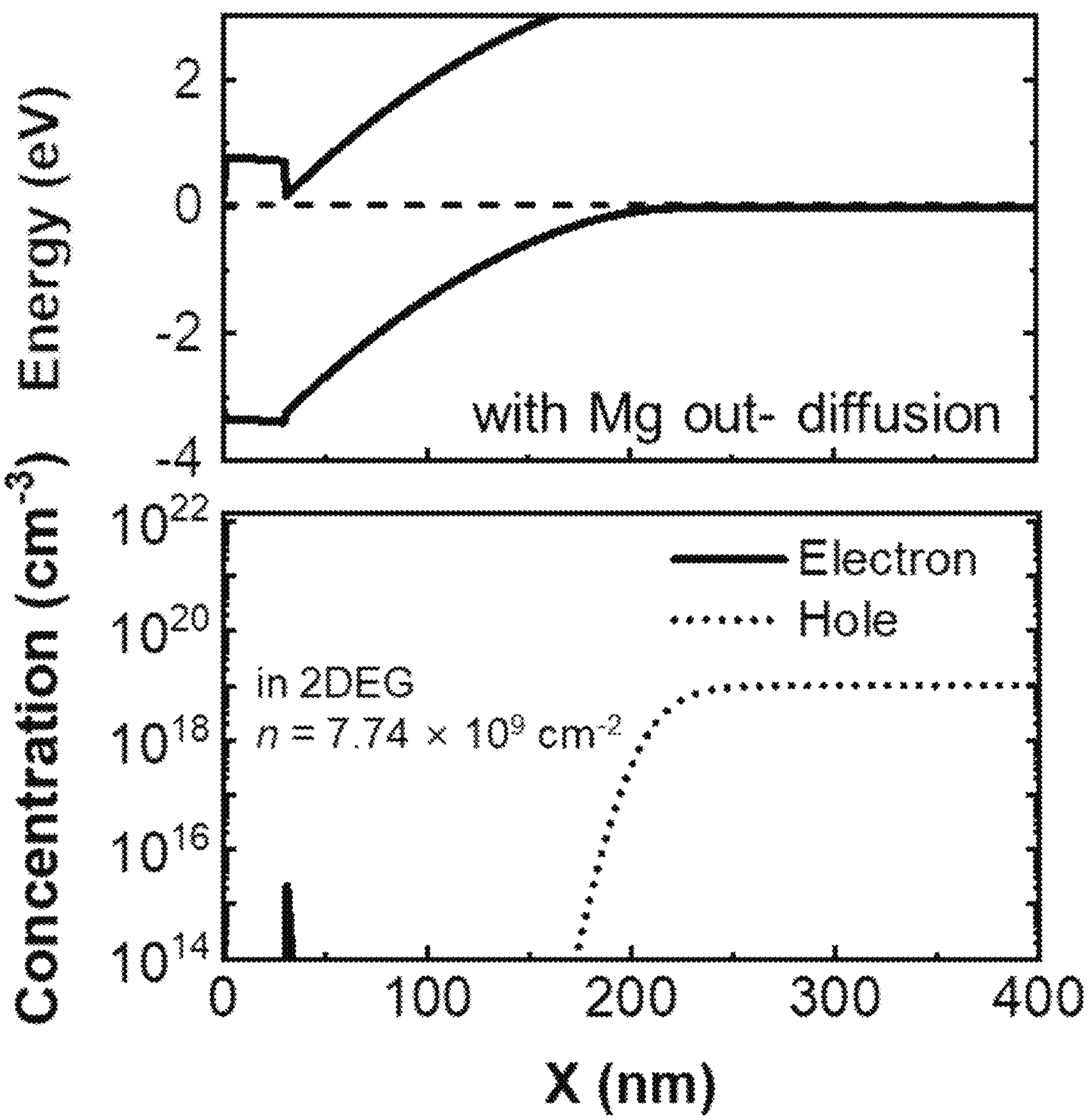
Figure 4D:
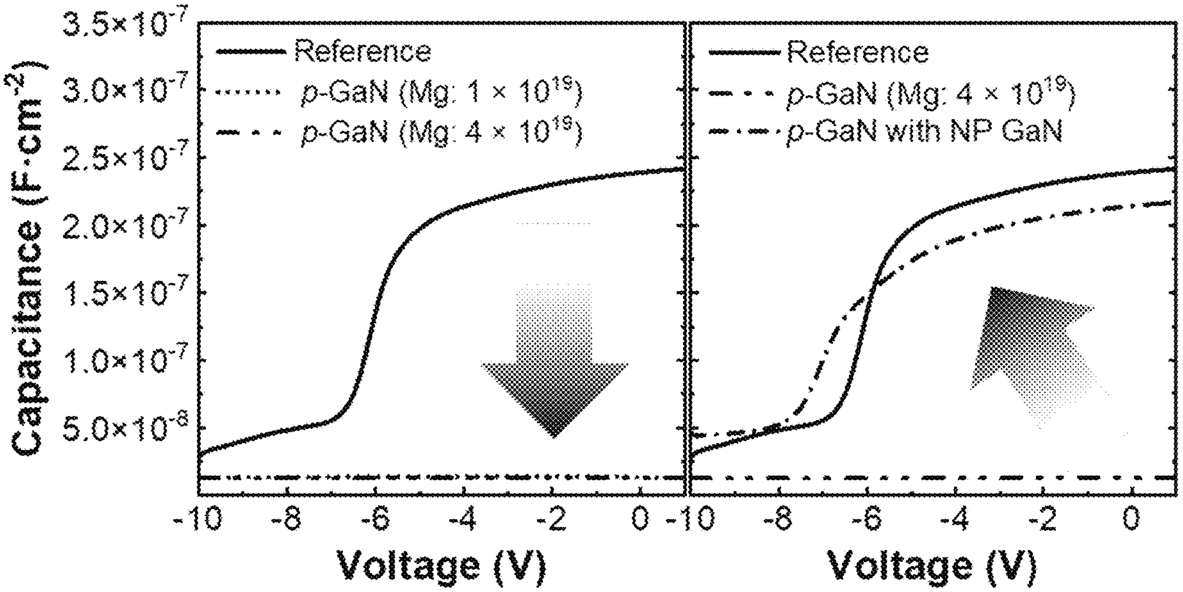
FIG. 4D shows CV results for structures with and without the NP-GaN.
Figure 4E:
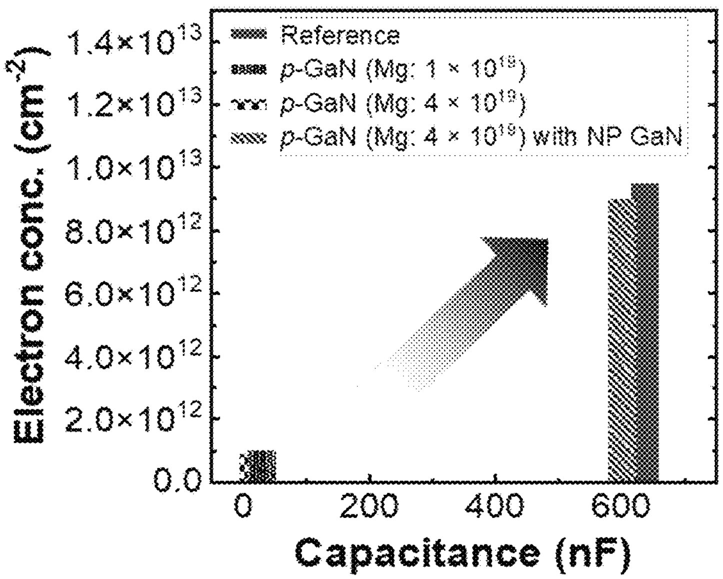
FIG. 4E shows 2DEG electron concentration as determined from the CV measurements of FIG. 4D for structures with and without the NP-GaN.

FIGS. 4A-C show bandgap simulation results of AlGaN/GaN structure grown on UID-GaN (FIG. 4A) or on p-GaN without (FIG. 4B) and with (FIG. 4C) the consideration of Mg out-diffusion. FIG. 4D shows C-V results of AlGaN/GaN 2DEG structure grown on p-GaN or UID-GaN with and without NP GaN. These C-V measurement were performed on these samples using contactless Hg-probe. FIG. 4E shows the electron concentration in 2DEG extracted from C-V results for the samples.

To understand the effect of Mg out-diffusion into AlGaN/GaN structures, the electron concentration in 2DEG were simulated with and without p-GaN. As shown in FIG. 4A, the Fermi level in the 2DEG without p-GaN is located above the conduction band and electron concentration in 2DEG is $1.08\times10^{13}$ cm$^{-2}$. In this case, the electrons are widely distributed in the UID-GaN layer since there is no potential barrier due to the presence of p-GaN. On the other hand, the electron concentration in 2DEG lowers to $2.25\times10^{12}$ cm$^{-2}$ with p-GaN (FIG. 4B). In particular, the total electron concentration is significantly decreased by the p-GaN-induced bandgap change, depleting the UID-GaN region. When considering the Mg out-diffusion by p-GaN (FIG. 4C), the Fermi level in 2DEG is shifted under the conduction band. The electron concentration in 2DEG is significantly decreased down to $7.74\times10^{9}$ cm$^{-2}$. Apparently, when the Mg out-diffusion occurs in a real AlGaN/GaN structure, it can be inferred that normal operation of HEMTs re-grown on p-GaN is impossible.

To investigate 2DEG characteristics of the samples, the capacitance-voltage (C-V) measurement was performed with results shown in FIG. 4D. The reference sample is a conventional AlGaN/GaN structure grown on UID-GaN, and two different Mg doping concentrations of p-GaN were selected as control samples which have the AlGaN/GaN 2DEG structure on the p-GaN. Consistent with the simulation results, the C-V curves show that the 2DEG characteristics vary depending on the presence of p-GaN. The reference sample shows general characteristic of 2DEG, whereas the control samples on both p-GaN conditions have no 2DEG property. Although the Mg doping concentration of p-GaN is reduced by more than 4 times (Mg: $8.0\times10^{18}$ cm$^{-9}$), the 2DEG characteristic of AlGaN/GaN structures is not restored. However, in the case of AlGaN/GaN regrown on NP GaN, it is shown that the 2DEG characteristic is restored almost identically to that of 2DEG regrown without p-GaN. The electron concentration of 2DEG with NP GaN ($8.92\times10^{12}$ cm$^{-2}$) is also almost the same level as that of HEMT regrown without p-GaN ($9.21\times10^{12}$ cm$^{-2}$)) as shown in FIG. 4E. The excellent stability of the 2DEG characteristic can be understood as the Mg compensation effect by NP GaN due to the C and O impurities remaining in the regrowth process. As shown in FIGS. 3A-B, SIMS analysis revealed that NP GaN generates impurities such as C and O in the regrown GaN. The C impurity gives GaN insulating properties and provides the effect of canceling the holes formed by the Mg impurity diffused from the p-GaN. O impurity also compensates for the holes created by Mg diffusion in the regrown AlGaN/GaN as donor material. As mentioned in the bandgap simulation, the 2DEG surface potential change of AlGaN/GaN grown on p-GaN is affected by Mg out-diffusion. The C-V curves shows that O and C impurities generated by NP GaN perfectly compensate for the Mg out-diffusion. Such utilization of NP GaN can provide not only compensating the Mg out-diffusion efficiently for the epitaxial structures including p-GaN but also enabling to fabricate the p-GaN embedded multi-junction devices for various GaN-based applications.

B3) Conclusions

In conclusion, suppressing or compensating Mg out-diffusion should be considered in high performance GaN-based devices embedding p-GaN. This leads to finding a suitable interfacial layer between p-GaN and adjacent films since one of the most critical aspects of regrowth on p-GaN is to force out the Mg out-diffusion effect for the desired bandgap structures. In this respect, we proposed a novel NP GaN structure on p-GaN for AlGaN/GaN 2DEG structure as a function of Mg out-diffusion compensator. It is described that the NP GaN/p-GaN structure offers to enhance the electron density in 2DEG because of the C and O impurities. A $Ga_xO_y$:C interlayer, formed spontaneously at the surface of the NP GaN layer during the EC etching process, between AlGaN/GaN and p-GaN contributes to the Mg compensation from the Mg out-diffusion of p-GaN. These advantageous properties enabled the fabrication of multiple epitaxial structures with embedded p-GaN. Our work opens the room for p-GaN embedded GaN-based opto-/electronics to benefit from the versatile heterostructures afforded by the III-nitride-based technologies.

The invention claimed is:

1. A method of compensating effects of Mg diffusion in growth of III-nitride devices, the method comprising:

depositing a first layer of Mg-doped p-type GaN on a device substrate;

depositing a second layer of GaN on the first layer;

etching a top surface of the second layer to make it porous, wherein pores of the second layer do not extend through the second layer; and depositing one or more additional device layers on the second layer after the etching;

wherein effects of Mg diffusion from the first layer into the one or more additional device layers are compensated by the second layer.

2. The method of claim 1, wherein the etching a top surface of the second layer to make it porous is performed with an electrochemical etch.

3. The method of claim 2, wherein the electrochemical etch is performed with an applied voltage in a range from 5 V to 20 V, whereby pores formed in the second layer are small enough to be removed by the deposition of the one or more additional device layers.

4. The method of claim 1, wherein the etching a top surface of the second layer to make it porous introduces C and/or O impurities into the second layer that provide compensatory doping of unintended doping due to Mg diffusion.

5. The method of claim 1, wherein deposition temperatures of the first layer, the second layer and the one or more additional device layers are each in a range from 800° C. to 1150° C.

6. The method of claim 1, wherein a deposition method of the first layer, the second layer and the one or more additional device layers is selected from the group consisting of: MOCVD (metal-organic chemical vapor deposition) and MOVPE (metal-organic vapor phase epitaxy).

7. The method of claim 1, wherein the device substrate includes a GaN buffer layer deposited on a substrate.

* * * * *